United States Patent [19]
Akeyama

[11] Patent Number: 6,011,728
[45] Date of Patent: Jan. 4, 2000

[54] SYNCHRONOUS MEMORY WITH READ AND WRITE MODE

[75] Inventor: Koichi Akeyama, Chiba, Japan

[73] Assignee: Kawasaki Steel Corporation, Kobe, Japan

[21] Appl. No.: 09/025,075

[22] Filed: Feb. 17, 1998

[30] Foreign Application Priority Data

Feb. 24, 1997 [JP] Japan ................................. 9-039252

[51] Int. Cl.[7] ................................................ G11C 16/04
[52] U.S. Cl. ..................... 365/189.05; 365/194; 365/233
[58] Field of Search .................................. 365/233, 194, 365/189.05, 230.08

[56] References Cited

U.S. PATENT DOCUMENTS

| | | | |
|---|---|---|---|
| 5,305,281 | 4/1994 | Lubeck | 365/230.04 |
| 5,396,463 | 3/1995 | Kim et al. | 365/189.11 |
| 5,488,580 | 1/1996 | Park | 365/189.05 |
| 5,511,029 | 4/1996 | Sawada et al. | 365/201 |
| 5,666,324 | 9/1997 | Kosugi et al. | 365/233 |
| 5,694,370 | 12/1997 | Yoon | 365/233.5 |
| 5,798,969 | 8/1998 | Yoo et al. | 365/189.05 |

*Primary Examiner*—Huan Hoang
*Assistant Examiner*—Hien Nguyen
*Attorney, Agent, or Firm*—Oliff & Berridge, PLC

[57] ABSTRACT

A semiconductor device that accesses a memory cell in synchronization with a clock signal and improves operation speed when data read-out and write-in are performed successively at the same address is provided.

This device includes:

at least two mode signal inputs that input operation mode signals that designate one of a read mode, a write mode, and an operation mode provided with a read-and-write mode;

an input data latch circuit that temporarily stores data to be written into a memory cell; and an operation control circuit that evaluates the operation mode designated by said operation mode signals, and, when an operation mode designated by said operation mode signals is evaluated to be said read-and-write mode, controls successive operations of a read-out operation, that is the same as that of said read mode, in a first step within one clock cycle, and during this operation, temporarily stores data that is to be written in a memory cell in said input data latch circuit, and next, in a second step of the same clock cycle, writes-in data temporarily stored in said input data latch circuit to a memory cell selected in said first step.

12 Claims, 14 Drawing Sheets

FIG. 1a
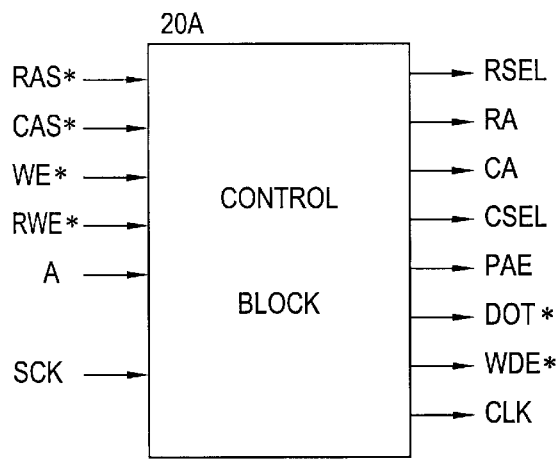
FIG. 1b
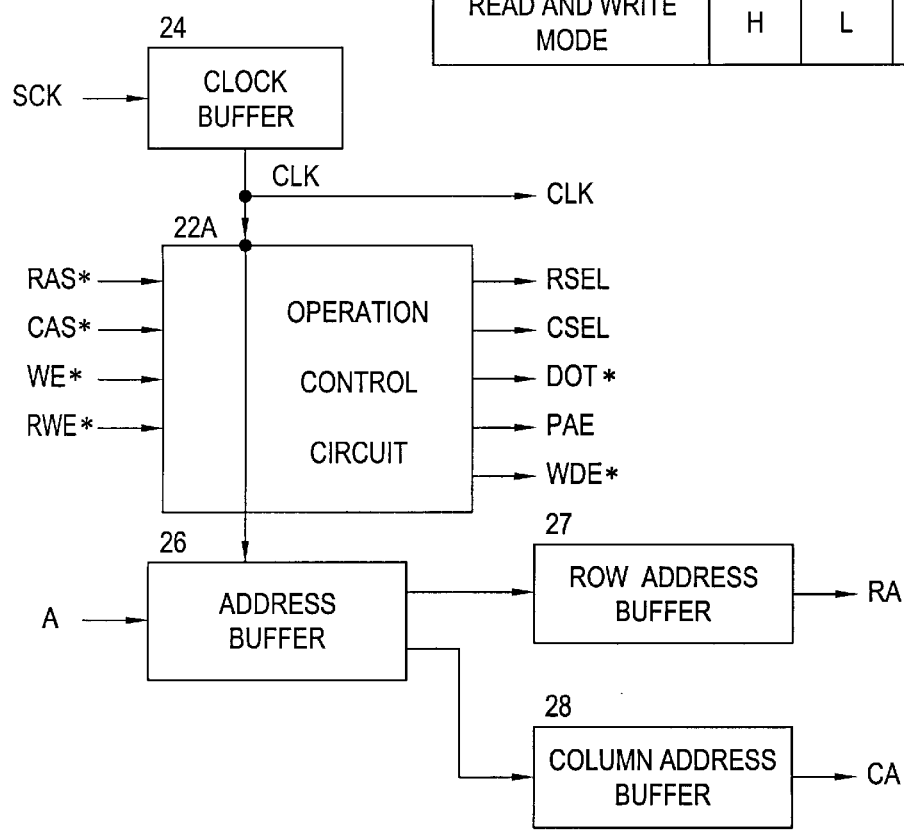
FIG. 1c
| MEMORY OPERATION MODE | RAS* | CAS* | WE* | RWE* |
|---|---|---|---|---|
| READ MODE | H | L | H | H |
| WRITE MODE | H | L | L | H |
| READ AND WRITE MODE | H | L | H | L |

FIG. 14a PRIOR ART
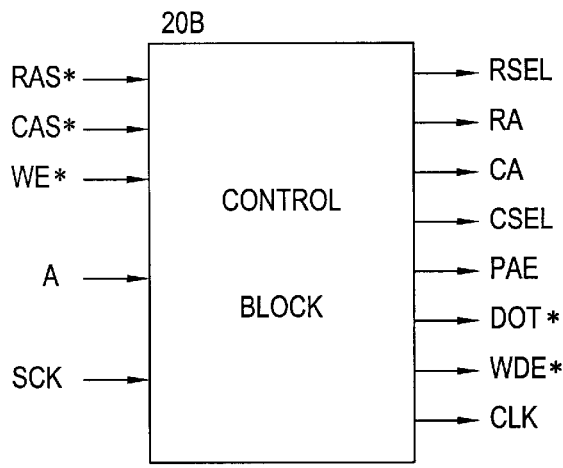
FIG. 14b
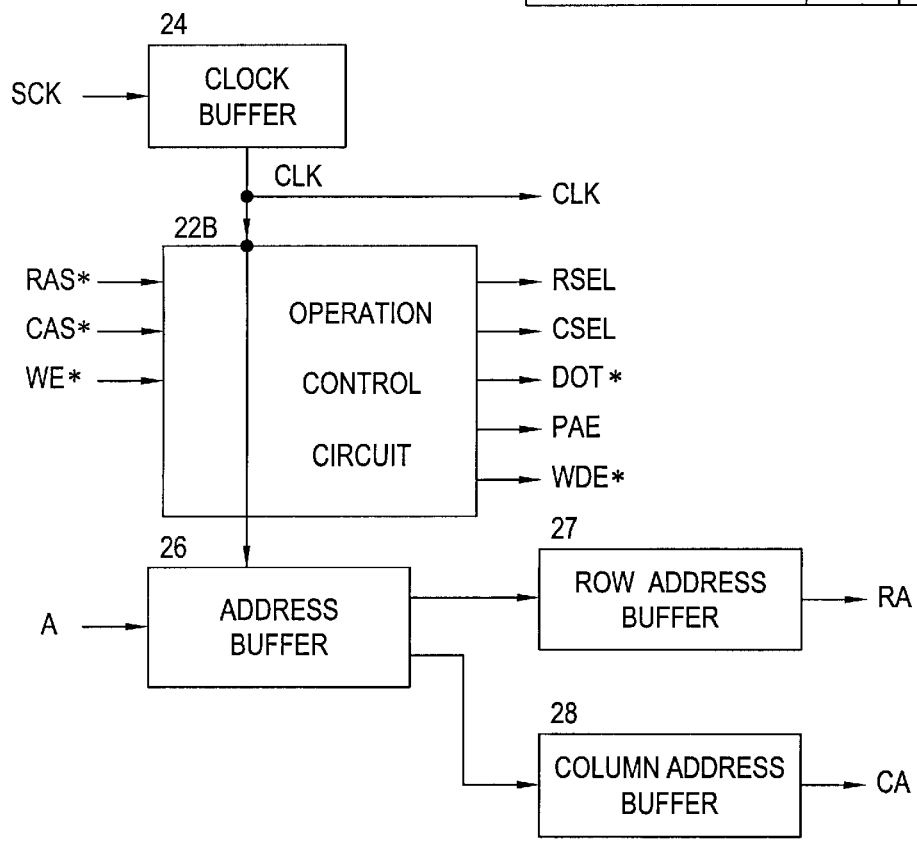
FIG. 14c
| MEMORY OPERATION MODE | RAS* | CAS* | WE* |
|---|---|---|---|
| READ MODE | H | L | H |
| WRITE MODE | H | L | L |

SYNCHRONOUS MEMORY WITH READ AND WRITE MODE

BACKGROUND OF THE INVENTION

1. Field of Invention

The present invention relates to a semiconductor memory device which accesses a memory cell in synchronization with a clock signal. In particular, the invention relates to a semiconductor memory device that improves the operating speed when successively performing data read-out followed by data write-in at the same address.

2. Description of Related Art

In order to realize high speed data accessing, various technologies in random accessible semiconductor devices (random access memory: hereafter RAM) have attracted public attention. High speed data transfer modes such as a high speed page mode and burst mode have been used.

Here, FIG. 12 is a timing chart which shows the operation of the RAM of a first prior art example.

This RAM reads-in the write-in signal WE* and the address signal ADR at the rise of the clock signal CLK. Further, when the write-in signal WE* is a write mode in an L state, the write-in data signal DI is taken-in at the rise.

Moreover, the "*" of WE*, row address strobe signal RAS* and column address strobe signal CAS*, which will be described hereafter, shows that the signal is negative logic.

Furthermore, in the timing chart of FIG. 12 and other figures, "invalid" shows that the read-out data signal DO is being renewed, and that the logic state is in a process of changing. Moreover, "valid" shows that the read-out data signal DO is established after the renewal. Further, concerning RAS*, CAS*, WE* and other input signals, or internal signals in the RAM, the broken line portions and the slanted line portions show that neither the H nor the L logic states influence the operating state in the operation of the RAM. Furthermore, the numbers which are numbered on the clock signal CLK of the timing chart are numbers for convenience of explanation which is performed using the timing chart. For example, "0" is a pulse 0, "1" is a pulse 1.

In FIG. 12 of the prior art, at the pulses 1, 3 and 5, at the time of each rise, the write-in signal WE* is in the H state, and the read mode is set, and the read-out access is performed. Moreover, at the pulses 2 and 4, the write mode is set, and the write access is performed.

FIG. 13 is a block diagram which shows the structure of the main parts of the RAM of a second prior art.

This prior art example has a control block 20B as shown in FIG. 13, and performs row selection in accordance with row address RA through a row decoder 12 and a row driver RD, then selects a column based on column address CA through a column decoder 14 and a column selecting circuit DS, and selects a memory cell MC in the memory cell array 10. Further, the symbol SCK of FIG. 13 shows a system clock, and an internal clock signal CLK is created based on the system clock.

When performing read-out access with respect to the selected memory cell MC, a data read-out circuit 44 is used. On the other hand, when performing write-in access, a data write-in circuit 46 and input data latch circuit 48 are used. Further, in both the read-out access and the write-in access, the bit line equalizing circuit 11 and data equalizing circuit 15, which perform equalization and pre-charge of the bit line are used. In FIG. 13, the symbol SA shows a sense amplifier.

Next, the control block 20B, as shown as FIG. 14b, is composed of an operation control circuit 22B, a clock buffer 24, an address buffer 26, a row address buffer 27 and a column address buffer 28. Moreover, the above-mentioned operation control circuit 22B is composed of an operation mode judgment circuit, of which the entire internal circuit structure is shown in FIG. 15, a read-out control circuit, which is shown in FIG. 16, and a write-in control circuit, which is shown in FIG. 17. The control block 20B thus structured creates and outputs each signal that is shown at the right of FIG. 14a based on each signal which is input from the left side in FIG. 14a.

Here, the aforementioned operation mode judgment circuit is explained by using FIG. 15. The row address strobe signal RAS*, the column address strobe signal CAS* and the write-in signal WE* are taken-in to flip flops FF 10~FF12 in synchronization with the clock signal CLK. In response to the various signals which are taken-in, a column selection signal CSEL is created using logic gates G10, G11 and G14 and delay circuits D11 and D12. Moreover, the read mode signal READ is created by using the logic gates G10 and G12, and the write mode signal WRITE is created using the logic gates G10 and G13.

Next, FIG. 18 is a timing chart which shows the operation of the RAM of this second prior art.

A high speed page mode is provided in this prior art. Thus, the prior art takes-in the row address signal ADX and performs the row address selection, and then the column address ADY is taken-in, and the column address selection is performed at the third pulse of the clock signal CLK. Next, at the rise of the clock signal CLK of this embodiment, it is determined whether the row address read-in will be performed, when the read mode will be set, and whether the write mode will be set, in accordance with the row address strobe signal RAS*, the column address strobe signal CAS*, and the write-in signal WE*, as shown in FIG. 14c.

For example, as shown in FIG. 18, pulse 1 to pulse 9 of the clock signal CLK indicate access to the address of the same page, thus, a high speed page mode is used.

First, the row address is read-in at pulse 1, then the row address is selected at the pulse 1 and pulse 2.

Moreover, at the pulses 3, 5, 7 and 9, the read mode is set at each rise of the clock pulse, and the read-out access is performed. During read-out access, not only is the read mode set at the rise of the clock signal CLK, but the taking-in of the column address ADY is also performed. After this, as shown at "invalid" in the figure, the read-out data signal DO is changed through the memory cell access in accordance with the column address signal ADY, after which the read-out data signal DO is set as shown at "valid" in the figure.

At pulses 4, 6 and 8, the write mode is set at each rise of the pulse, and write-in access is performed. By this write-in access, at the rises of the clock signal CLK, the write mode is set and the column address signal ADY is taken-in, and further, the write-in data signal DI is taken-in. The write-in data signal DI thus read-in is written-into the memory cell which is indicated by the column address signal ADY during one cycle of the clock signal CLK.

FIG. 11a is a timing chart which shows the operation of prior art which includes the aforementioned first prior art and second prior art.

In this FIG. 11a, "the operation mode signal" as in the first prior art, is a signal for setting the read mode or the write mode in the RAM (hereafter called the first prior art RAM) which takes-in an address during one cycle of the clock signal CLK without distinguishing between the row address and column address. Or, as in the second prior art, in a RAM (hereafter called the second prior art RAM) which, after taking in the row address strobe signal RAS* during one or more clock pulses, then performs the read-out access or the write-in access while reading in a column address strobe signal CAS* during a pulse cycle of a separate clock signal CLK, it is a signal which reads-in the row address and sets a memory operation mode such as the read mode or the write mode.

Accordingly, the row address strobe signal RAS*, the column address strobe signal CAS*, and the write-in signal WE* are included in this operation mode signal of the aforementioned first prior art or second prior art.

The read-out access operation is explained in FIG. 11a.

A1 (operation mode judgment): evaluate the operation mode in accordance with the operation mode signal.

A2 (address selection): perform an address selection. A row address and a column address selection are performed in the first prior art RAM. As for the second prior art RAM, only the column address selection is performed here, since the row address already has been selected during a previous clock signal CLK.

A3 (sense amp operation): perform read-out of the data in the selected memory cell using a data line and a sense amp.

A4 (output latch): temporarily store the output of the sense amp in the output data latch circuit, then perform an operation which outputs the signal from the RAM.

C1 (release the address selection): in the first prior art RAM, the selection of the row address and the column address are released. Or, in the second prior art RAM, the selection of the column address is released.

C2 (equalize and pre-charge): perform equalizing and pre-charging of the data line (or perform equalizing and pre-charging of the data line and the bit line).

Next, in FIG. 11a, the operations of the write-in access are explained in order.

B1 (operation mode judgment): evaluate a write mode in accordance with the operation mode signal.

B2 (address selection): perform selection of the row address and the column address in the first prior art RAM. Or in the second prior art, the row address already has been selected during a prior clock signal CLK, so only the column address selection is performed.

B3 (memory cell write-in operation): perform the actual write-in operation of the write-in data inputted into the memory cell whose address is selected.

C1 (release the address selection): same as C1 of the read-out access.

C2 (equalize and pre-charge): same as C2 of the read-out access.

In both the first prior art and the second prior art, the read-out access and the write-in access are independent operation cycles, each requiring operation mode judgment and the address selection. When using the RAM with respect to the same address memory cell, there are cases when the write-in access is performed after performing the read-out access. In this case, both the first prior art and the second prior art need 2 pulses (2 clocks) of the clock signal CLK.

Here, when performing the read-out access and the write-in access in this order into a memory cell of the same address, it is sufficient to just use the former operation mode judgment and the former address selection, and the operation mode judgment and the address selection for write-in access is repeated.

For example, in the first prior art as shown in FIG. 12, the time from t1 to t2 is the period to perform the word line selection completion processing, the column address selection completion processing, and pre-charging and equalizing of the bit line and the data line, and the like. Moreover, the time from t2 to t3 is the period to perform the address decoding, word line selection and column address selection. These two periods become redundant when successively performed for read-out access and write-in access with respect to the same memory cell.

Moreover, in the second prior art as shown in FIG. 18, the time t1 to t2 is the period to perform the column address completion processing, pre-charge and equalization of the data line, and the like. Moreover, from the time t2 to t3 is the period to perform the column address decoding and the column address selection. These periods become redundant when performing read-out access and write-in access successively, and the operating speed becomes lower.

The present invention solves these prior problems, and has an object of providing a semiconductor memory device which improves the operating speed when performing successive read-out and write-in at the same address. Moreover, it has an object of providing an integrated circuit or electronic system which includes this kind of semiconductor memory device as a component thereof.

SUMMARY OF THE INVENTION

The present invention resolves the above-mentioned problems by providing, in an electronic system that includes a memory device that accesses a memory cell in synchronization with a clock signal: at least two mode signal inputs that input operation mode signals that designate one of a read mode, a write mode, and an operation mode provided with a read-and-write mode, an input data latch circuit that temporarily stores data to be written into a memory cell, and an operation control circuit that evaluates the operation mode designated by said operation mode signals, and, when an operation mode designated by said operation mode signal is evaluated to be said read-and-write mode, controls the successive operations of carrying out a read-out operation that is the same as that of said read mode in a first step within one clock cycle, and during this operation, temporarily stores data that is to be written in a memory cell in said input data latch circuit, and next, in a second step of the same clock cycle, writes-in data temporarily stored in said input data latch circuit to the memory cell selected in said first step.

Moreover, in said electronic system, said at least two mode signal inputs each include mutually different signals of a row address strobe signal, a column address strobe signal, a write-in signal and a read-and-write mode signal.

In said electronic system, said operation control circuit comprises a read-out control circuit, a write-in control circuit, and an operation mode judgment circuit that evaluates an operation mode that is designated from at least two operation mode signals that are input from outside, and causes said read-out control circuit and said write-in control circuit to operate, and in said operation mode judgment circuit, causes said read-out control circuit to operate when the operation mode is the read mode; causes said write-in control circuit to operate when the operating mode is the write mode; and when the operation mode is the read-and-write mode, first activates said read-out control circuit, and at the timing after the read-out data has been completed, activates said write-in control circuit.

Here, said electronic system includes the semiconductor device, and particularly includes a semiconductor memory device and a semiconductor integrated circuit.

BRIEF DESCRIPTION OF THE DRAWINGS

FIG. 1a is a block diagram which shows the input/output signals of control block 20A in an embodiment of a RAM in accordance with the present invention.

FIG. 1b is a block diagram which shows the inner structure of the control block.

FIG. 1c is a memory operation mode table of the present embodiment.

FIG. 14a is a block diagram which shows the input/output signals of the control block of the second prior art RAM.

FIG. 14b is a block diagram which shows the internal structure of the control block.

FIG. 14c is a memory operation mode table of the second prior art RAM.

DETAILED DESCRIPTION OF PREFERRED EMBODIMENTS

Hereafter, an embodiment of the present invention is explained with reference to the drawings.

Figure 13:
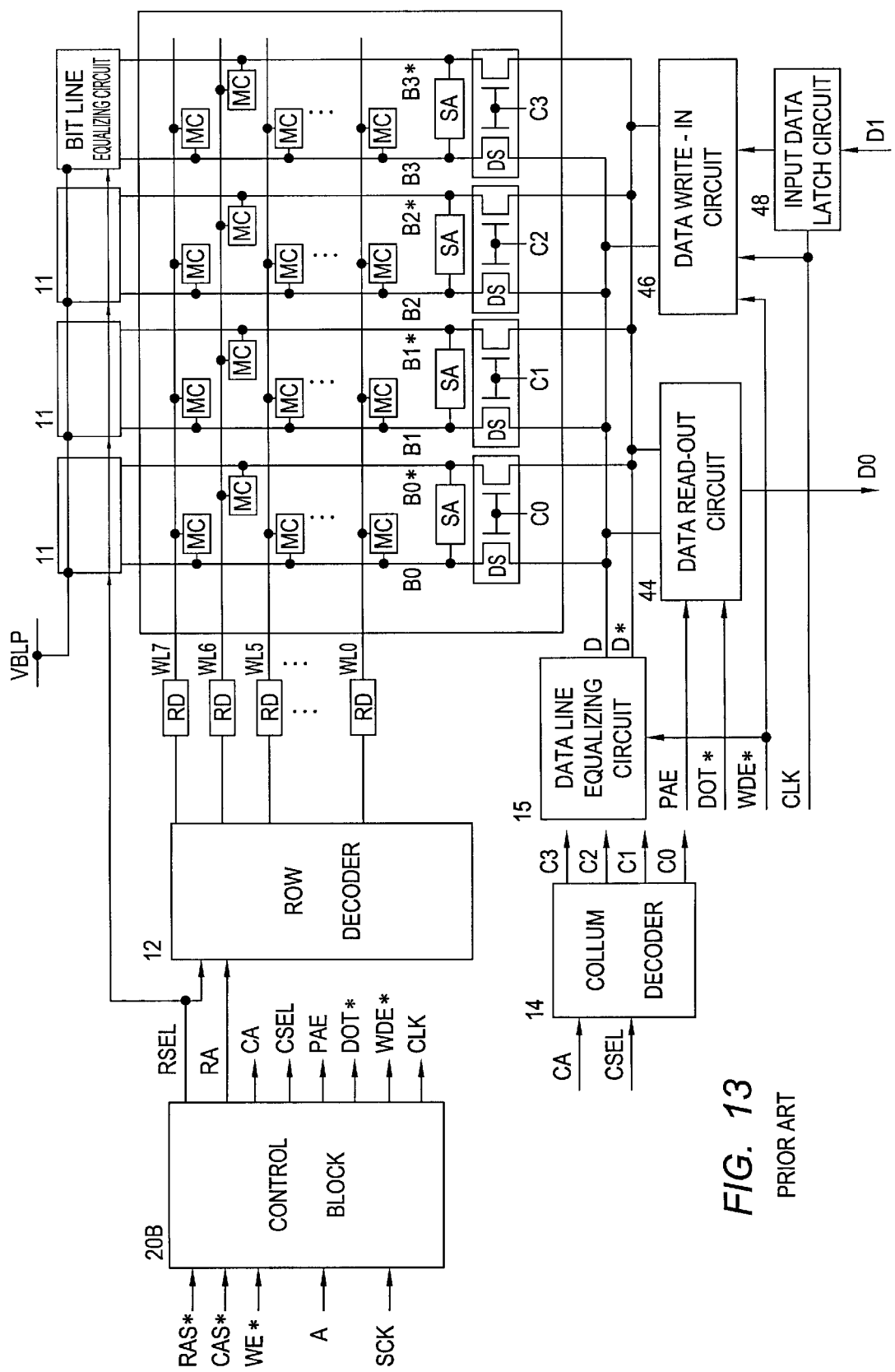
FIG. 13 is a block diagram which shows the structure of the second prior art RAM.
Figure 15:
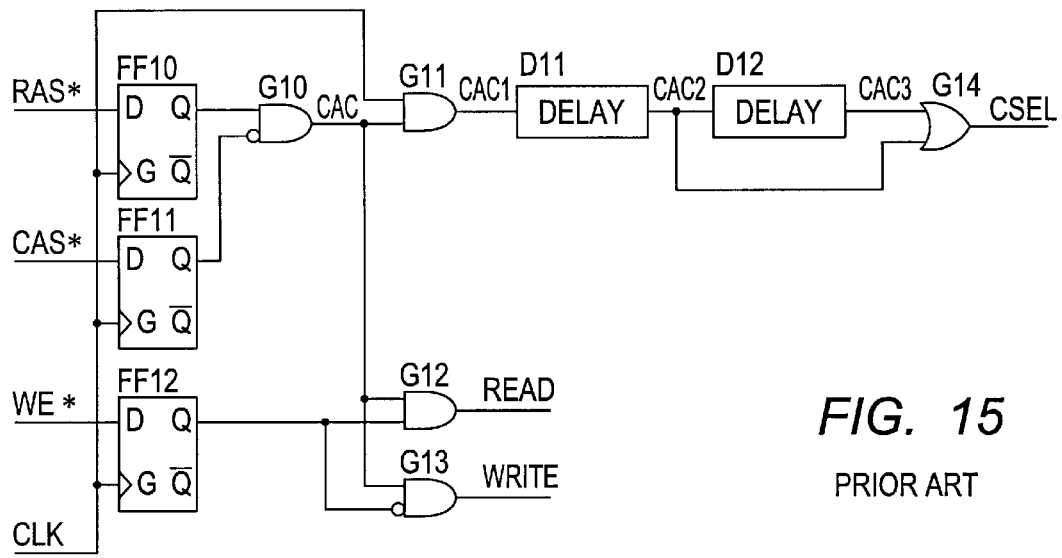
FIG. 15 is a circuit diagram of the operation mode judgment circuit in the operation control circuit of the first prior art RAM.
Figure 16:
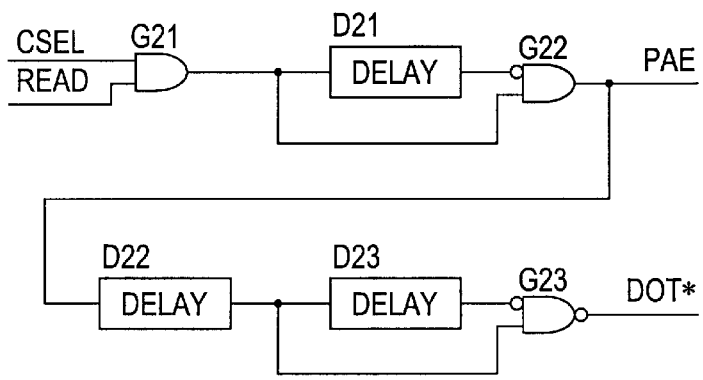
FIG. 16 is a circuit diagram of the read-out control circuit in the operation control circuit of the second prior art RAM.
Figure 17:
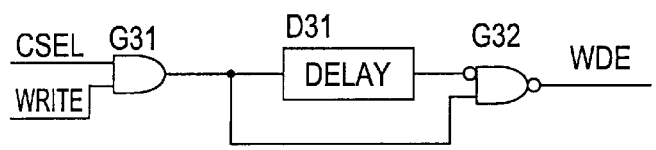
FIG. 17 is a circuit diagram of the read-out control circuit in the operation control circuit of the second prior art RAM.
Figure 18:
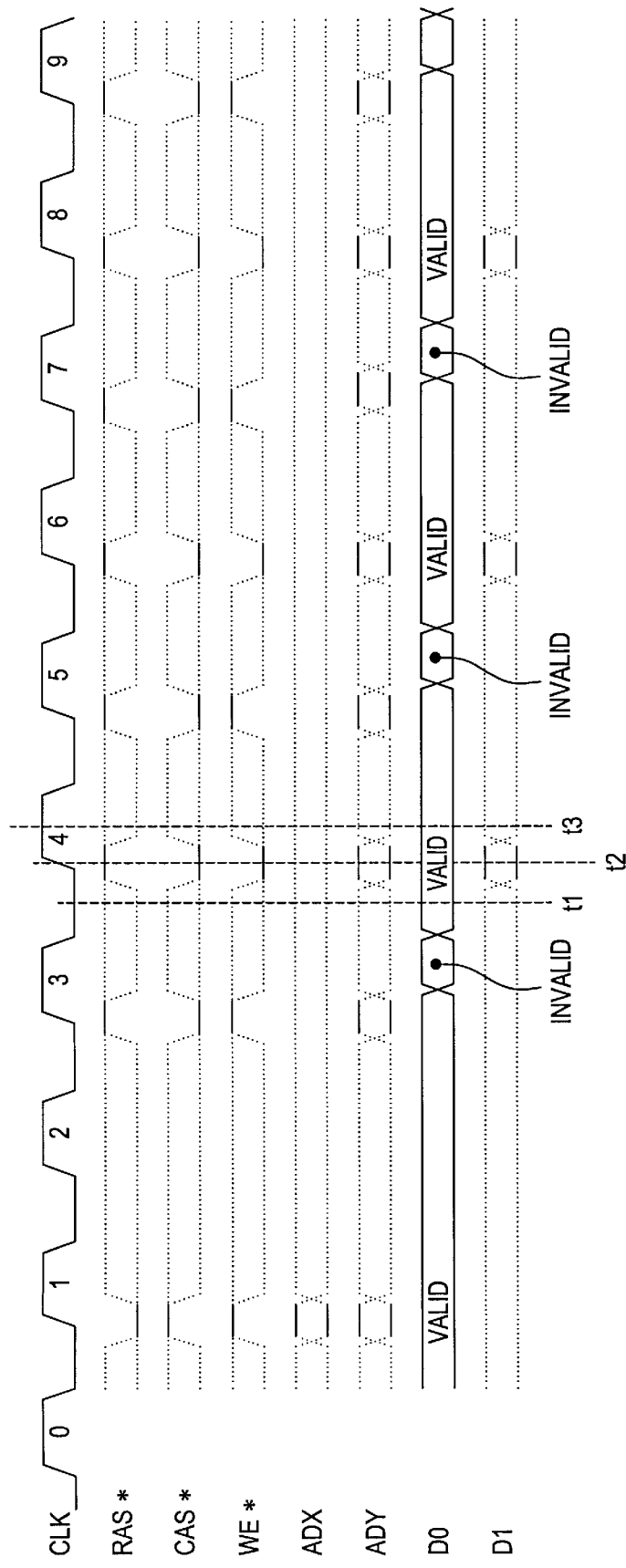
FIG. 18 is a timing chart which shows the operation of the second prior art RAM.

An embodiment in which the present invention is adopted has the control block 20A of FIG. 1a instead of the control block 20B of the structure of the aforementioned FIG. 13. Moreover, the difference in the circuit structure between the second prior art and the present embodiment is the control block 20A. For this control block 20A, compared to the above-mentioned control block 20B, the read-and-write mode signal RWE* is additionally input. This signal is input from an external source in the present embodiment.

In the present embodiment, the main operation mode signals are the write-in signal WE* and the read-and-write mode signal RWE*, and further, the row address strobe signal RAS* and the column address strobe signal CAS*. Moreover, these signals are the mode signal input of the present embodiment of the invention.

Figure 2:
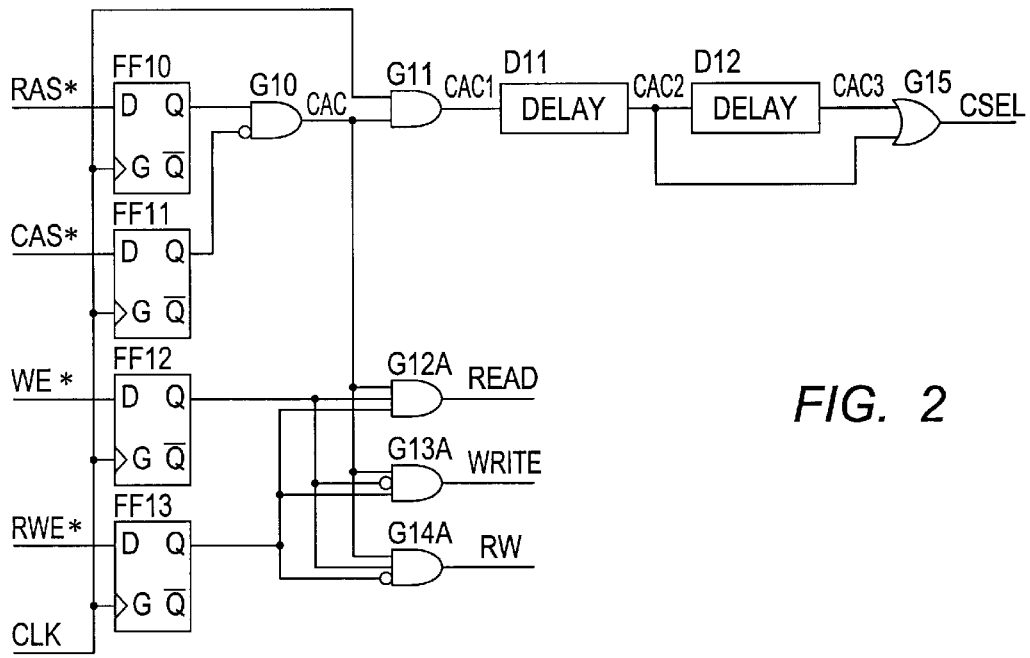
FIG. 2 is a circuit diagram of an operation mode judgment circuit in the operation control circuit of the control block 20A of the RAM in accordance with the present invention.
Figure 3:
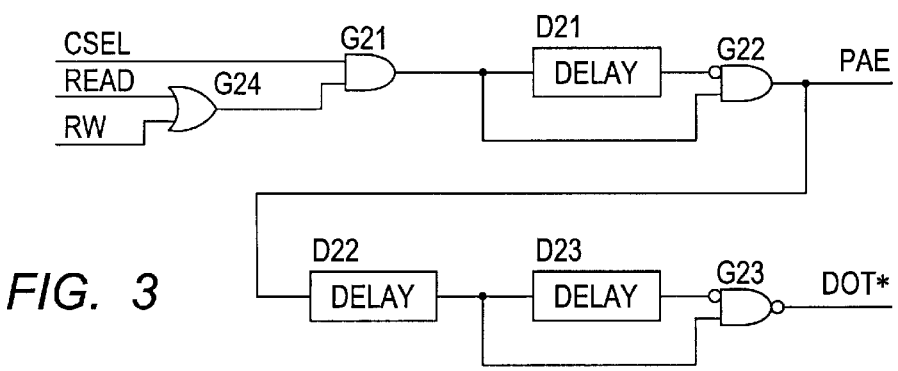
FIG. 3 is a circuit diagram of a read-out control circuit in accordance with the present invention.
Figure 4:
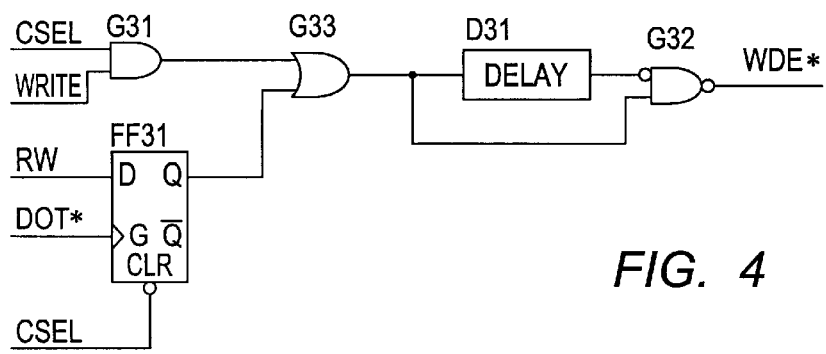
FIG. 4 is a circuit diagram of a write-in control circuit in accordance with the present invention.

Internally, the above-mentioned control block 20A has a clock buffer 24, an address buffer 26, a row address buffer 27 and a column address buffer 28, the same as the aforementioned control block 20B. Moreover, the aforementioned control block 20A has an operation control circuit 22A which is different from the above-mentioned control block 20B. The aforementioned operation control circuit 22A is comprised by the operation mode judgment circuit, which is shown in FIG. 2, the read-out control circuit, which is shown in FIG. 3, and the write-in control circuit, which is shown in FIG. 4.

Each internal part of the operation control circuit 22A is explained. First of all, the operation mode judgment circuit, in FIG. 2, takes in the row address strobe signal RAS*, the column address strobe signal CAS*, the write-in signal WE* and the read-and-write mode signal RWE* to the flip flops FF10~FF13 at the rise of the clock signal CLK. Based on each signal which is taken-in like this, as shown in the operation mode table of FIG. 1c, the read mode signal READ, the write mode signal WRITE, and the read-and-write mode signal RW are created by the logic gates G10 and G12A~G14A. Moreover, column selection signal CESL is created by the logic gates G10, G11 and G15, and the delay circuits D11 and D12. Here, each signal which is created in this operation mode judgment circuit is also used in the read-out control circuit and the write-in control circuit.

Figure 5:
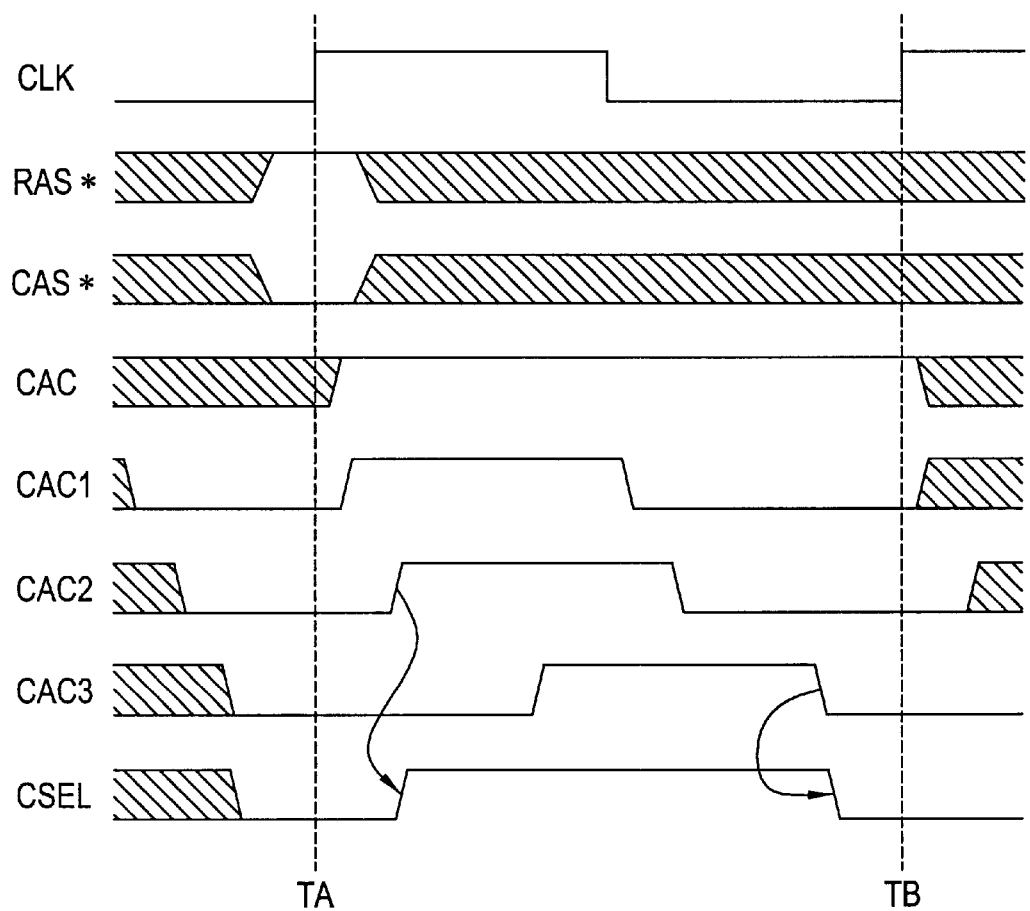
FIG. 5 is a timing chart which shows a column selection signal CSEL generating operation in an operation mode judgment circuit in accordance with the present invention.

The timing of generation of the column selection signal CESL is shown in the timing chart of FIG. 5.

At the rise of the clock signal CLK, the row address strobe signal RAS* in the H state and the column address strobe signal CAS* in the L state are taken-in to the flip flops FF10 and FF11, and an internal signal CAC, which is output by the logic gate G10, rises up. When the internal signal CAC rises, the clock signal CLK is also in the H state, and an internal signal CAC1, which is output by the logic gate G11, also rises. The length of time that the internal signal CAC1 is in the H state is equal to the time that the clock signal CLK is in the H state. The internal signal CAC1 is delayed by the delay circuits D11 and D12, and the internal signals CAC2 and CAC3 are created. The logic gate G15 outputs the column selection signal CSEL as the logical sum of the internal signals CAC2 and CAC3.

Figure 6:
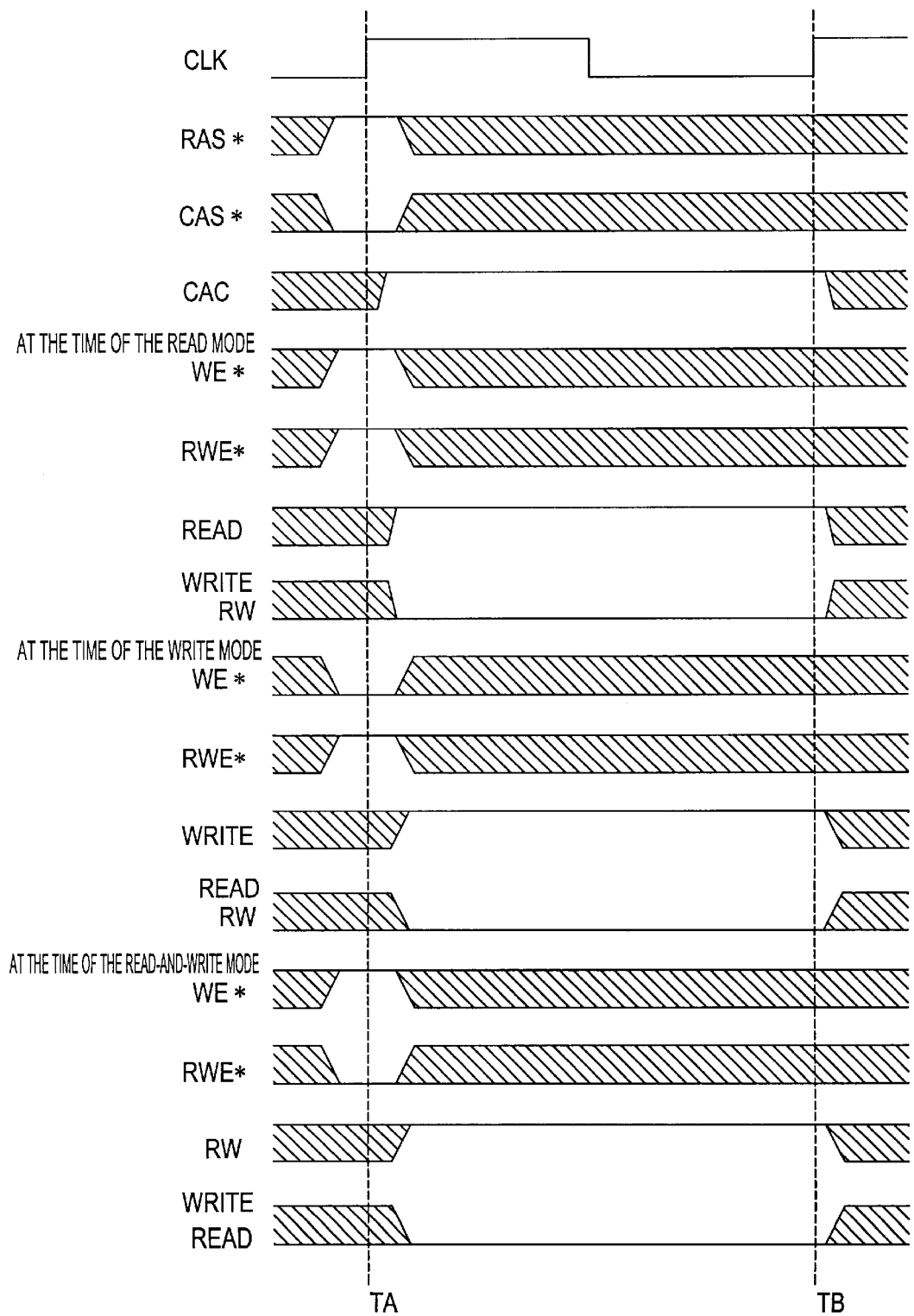
FIG. 6 is a timing chart which shows an operation for generating a read mode signal READ, a write mode signal WRITE, and a read-and-write mode signal RW in an operating mode judgment circuit in accordance with the present invention.

In the present operation judgment circuit, the timing of the creation of the read mode signal READ, the write mode signal WRITE and the read-and-write mode signal RW are shown in the timing chart of FIG. 6.

In this timing chart, with respect to the clock signal CLK, the row address strobe signal RAS*, the column address strobe signal CAS* and the internal signal CAC, the timing of the write-in signal WE*, the read-and-write mode signal RWE*, the read mode signal READ, the write mode signal WRITE and the read-and-write mode signal RW are shown, each at the time of the read mode which performs the read-out access, at the time of write mode which performs the write-in access, and at the time of read-and-write mode signal RWE* which performs the write-in access after performing the read-out access with respect to the same memory cell MC.

First, the read mode is explained. At the rise of the clock signal CLK, the row address strobe signal RAS* in the H state, the column address strobe signal CAS* in the L state, the write-in signal WE* in the H state and the read-and-write mode signal RWE* in the H state are taken in, the read mode signal READ goes to the H state, and the write mode signal WRITE and the read-and-write mode signal RW go to the L state.

Next, in the write mode, the row address strobe signal RAS* in the H state, the column address strobe signal CAS* in the L state, the write-in signal WE* in the L state and the read-and-write mode signal RWE* in the H state are taken-in at the rise of the clock signal CLK, the write mode signal WRITE goes to the H state, and the read mode signal READ and the read-and-write mode signal RW go to the L state.

In the read-and-write mode, the row address strobe signal RAS* in the H state, the column address strobe signal CAS* in the L state, the write-in signal WE* in the H state and the read-and-write mode signal RWE* in the L state are taken-in at the rise of the clock signal CLK, the read-and-write mode signal RW goes to the H state, and the write mode signal WRITE and the read mode signal READ go to the L state.

Figure 7:
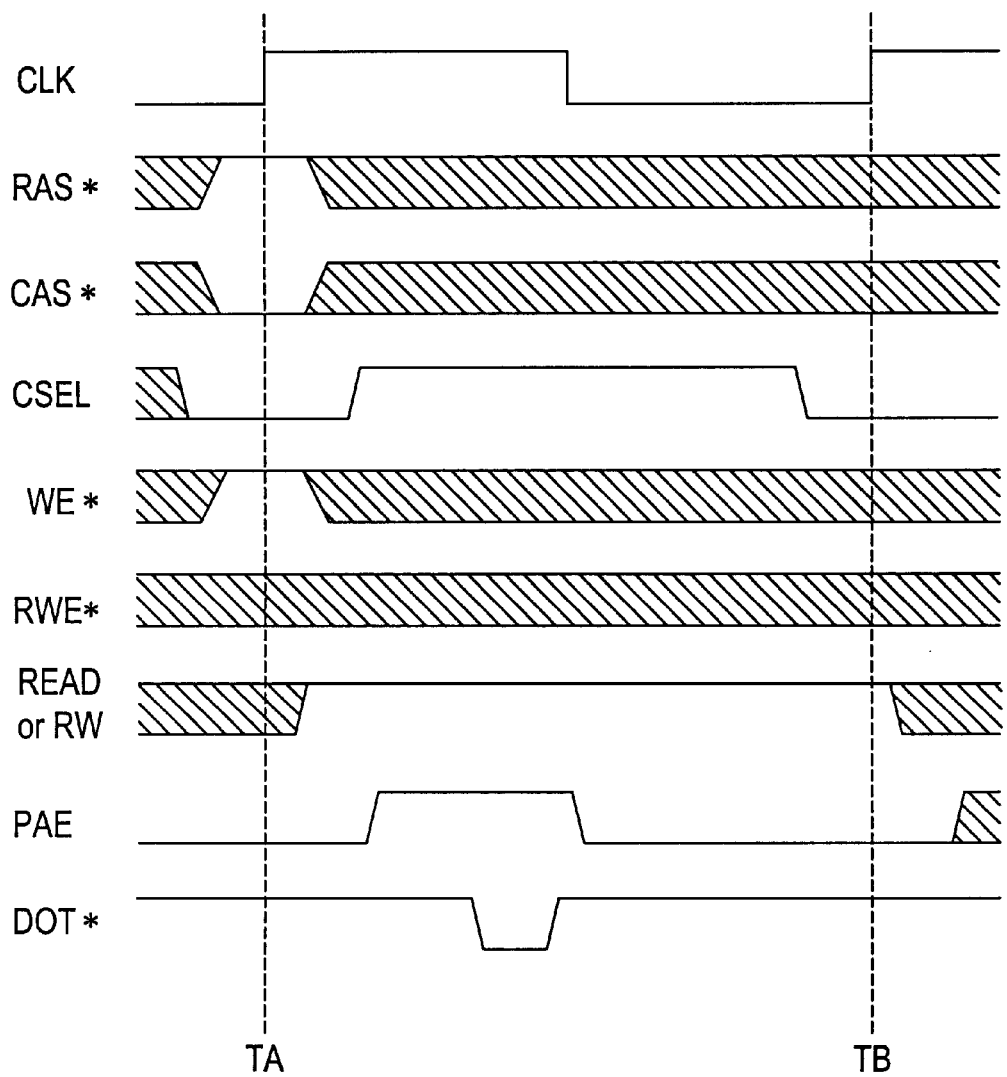
FIG. 7 is a timing chart which shows the operation of the read-out control circuit in accordance with the present invention.

Next, the read-out control circuit of the operation control circuit 22A is explained using the circuit diagram of FIG. 3 and the timing chart of FIG. 7. The signals that are obtained through the logic gates G24 and G21 are based on the column selection signal CSEL, the read mode signal READ and the read-and-write mode signal RW and are input to the delay circuit D21 and the logic gate G22. The logic gate G22 outputs an internal signal PAE based on the input signal and the output of the delay circuit D21. Here, the length of time that the internal signal PAE is in the H state is equal to the delay time of the delay circuit D21.

Moreover, in the read-out control circuit, based on the internal signal PAE, the internal signal DOT* is created using the delay circuits D22 and D23 and the logic gate G23. When the internal signal PAE rises, the internal signal DOT* drops after the delay period of the delay circuit D22. Moreover, the length of time that the internal signal DOT* is in the L state equals the delay period of the delay circuit D23.

Figure 8:
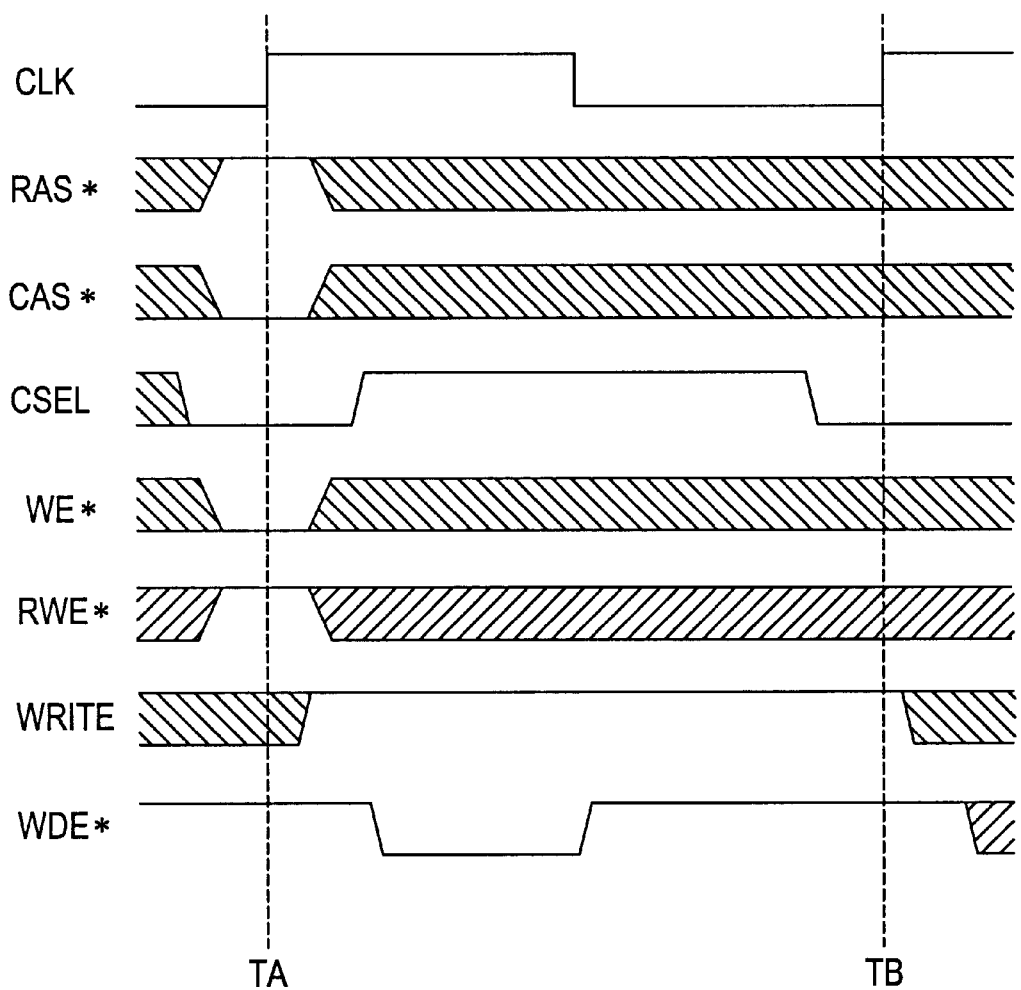
FIG. 8 is a timing chart which shows the operation at the time of the write mode of the write-in control circuit in accordance with the present invention.
Figure 9:
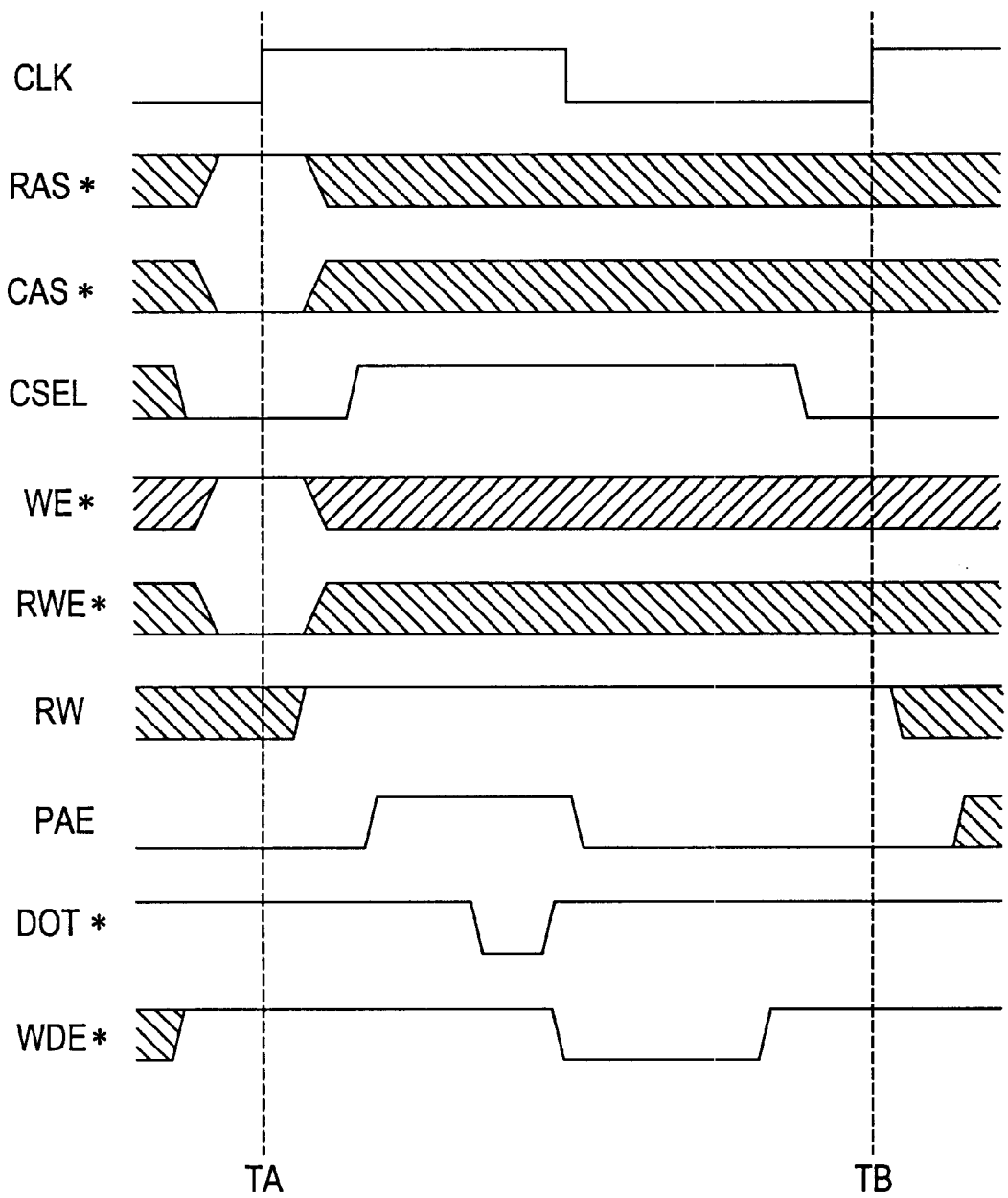
FIG. 9 is a timing chart which shows the operation at the time of the read-and-write mode of the above-mentioned write-in control circuit.

Next, the circuit diagram of FIG. 4 of the write-in control circuit which is built into the operation control circuit 22A is explained using the timing charts of FIG. 8 and FIG. 9. In particular, FIG. 8 shows the operation at the time of the write mode, which only performs the write-in access. FIG. 9 shows the operation of the read-and-write mode, which performs the write-in access after performing the read-out access.

In the write mode, when the internal signal DOT* rises and the column selection signal CSEL is in the H state, the flip flop FF31 takes-in the read-and-write mode signal RW. The logic gate G33 outputs the result of the logic sum calculation of the output of the flip flop FF31 and the logic product of the column selection signal CSEL and the write mode signal WRITE through the logic gate G31. The logic gate G32 outputs a write-in buffer effective signal WDE* based on the output of logic gate G33 and on the signal output by the logic gate G33 that has been delayed by the delay circuit D31. In the timing chart of FIG. 8, the length of time that the write-in buffer effective signal WDE* is in the L state equals the delay time of the delay circuit D31.

The write-in buffer effective signal WDE* of FIG. 8 goes to the L state and becomes valid in the first half of 1 cycle of the clock signal CLK. In comparison, in the read-and-write mode of FIG. 9, the write-in effective signal WDE* goes to the L state and becomes valid during the last half of 1 cycle of the clock signal. This is because, in the read-and-write mode, after first activating the read-out circuit and performing the read-out access, and storing the read-out data, the write-in access is next performed by activating the write-in control circuit.

As explained above, the data read-out circuit 44, the data write-in circuit 46, the bit line equalizing circuit 11, the data equalizing circuit 15 and other circuit parts that are shown in FIG. 13 are controlled by the row selection signal RSEL, the column selection signal CSEL, the internal signal DOT*, the internal signal PAE and the write-in buffer effective signal WDE*, which are obtained through the operation control circuit which is composed by the operation mode judgment circuit, the read-out control circuit and the write-in control circuit.

In short, in the read mode which only performs read-out access, the data read-out circuit 44 is controlled by the signal of the operation control circuit 22A, and the data is read-out to the outside of the semiconductor memory device from the selected memory cell MC. In the write mode, which only performs the write-in access, the data write-in circuit 46 is controlled by the operation control circuit 22A, the data which is taken-in from outside to the input data latch circuit 48 at the rise of the clock signal CLK is written-in to the selected memory cell through the data write-in circuit 46, which is controlled by the operation control circuit 22A.

In the read-and-write mode, which is a feature of this embodiment and which performs write-in access after performing read-out access with respect to the memory cell of the same address, the data of the selected memory cell MC is read-out by using the data read-out circuit 44 at a first step of 1 clock cycle, and during this first step, write-in data is taken into the input data latch circuit 48 from outside at the rise of the clock signal CLK under the control of the operation control circuit 22A. Next, in the second step of the 1 clock cycle, the write-in data which has already been temporarily stored in the input data latch circuit 48 is written-in by using the data write-in circuit 46 to the memory cell which has already been selected in the first step.

In order to perform the read-out operation, the data write-in timing of the read-and-write mode is delayed within 1 cycle of the clock signal CLK compared to the write mode, and is in the last half of the cycle. Because of this, as described in the explanation of FIGS. 4, 8 and 9, in the read-and-write mode, the timing at which the write-in buffer effective signal WDE* becomes valid (L state) in the cycle is delayed compared to the write mode, and comes after the L state of the internal signal DOT*, when the read-out data is established.

Figure 10:
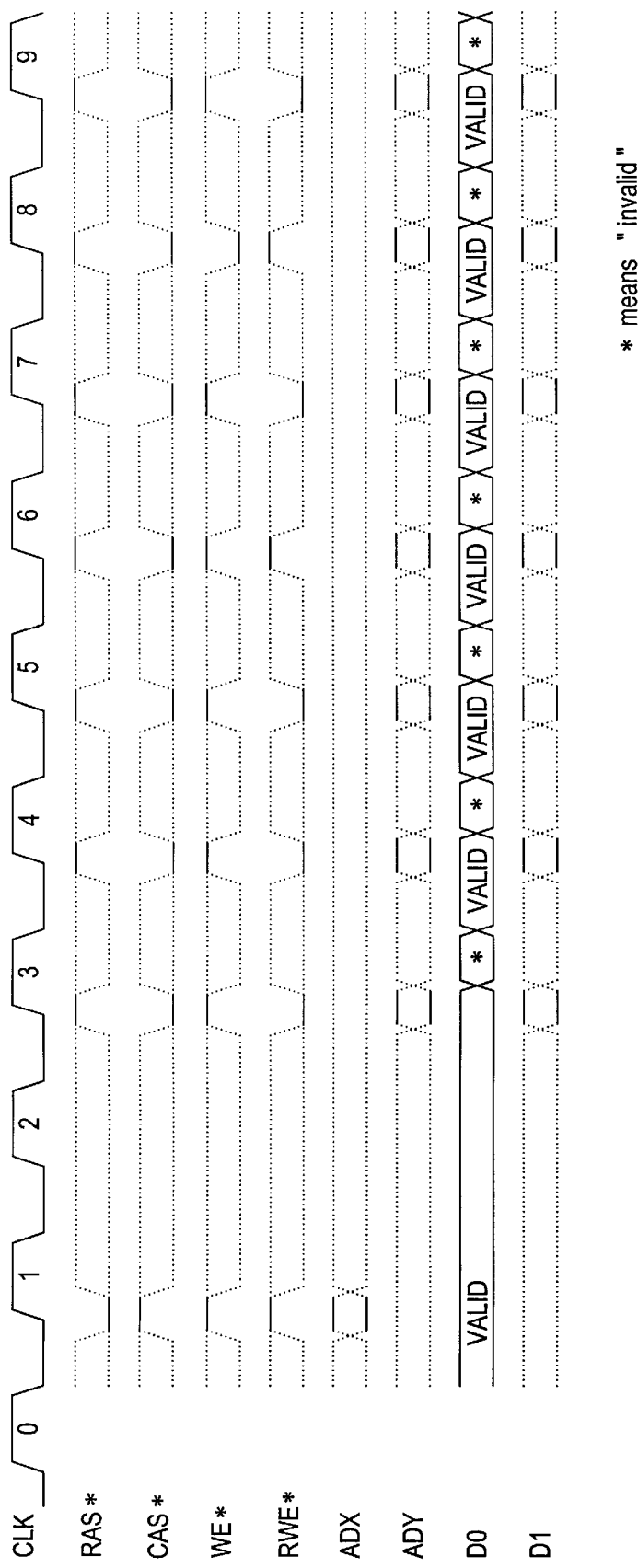
FIG. 10 is a timing chart which shows the operation of the RAM embodiment in accordance with the present invention.

FIG. 10 is a series of timing charts which show the operation of the present embodiment.

The present embodiment uses the present invention with respect to the aforementioned second prior art RAM. In short, in the present embodiment RAM, the read-in and setting of the row address strobe signal RAS* are performed at the rise of the clock signal CLK. Then, at the rise of the second pulse of the clock signal CLK, the processing of one of the read mode and write mode or the read-and-write mode is performed while performing the read-in and setting of the column address.

For example, in FIG. 10, at the rise of the pulse 1 of the clock signal CLK, the judgment and the setting of the row address read-in are performed as shown in the memory operation mode table of FIG. 1c. Moreover, from pulse 1 to pulse 3 and thereafter, one of the operations of the read mode, the write mode and the read-and-write mode is performed while performing the read-in of the column address.

Specifically, in FIG. 10, the read-and-write mode is performed at pulses 3, 4, 5, 7 and 9. The read mode is performed at pulse 6. At pulse 8, the write mode is performed.

As explained above, according to the present embodiment, it is possible to set the operation mode of the read-and-write mode by adopting the present invention. In short, during the cycle of 1 pulse of the clock signal CLK, it is possible to successively perform the read-out access and the write-in access with respect to a memory cell of the same address. Accordingly, it is possible to eliminate the redundant processing of the write-in access, and the entire processing time can be shortened.

Figure 11:
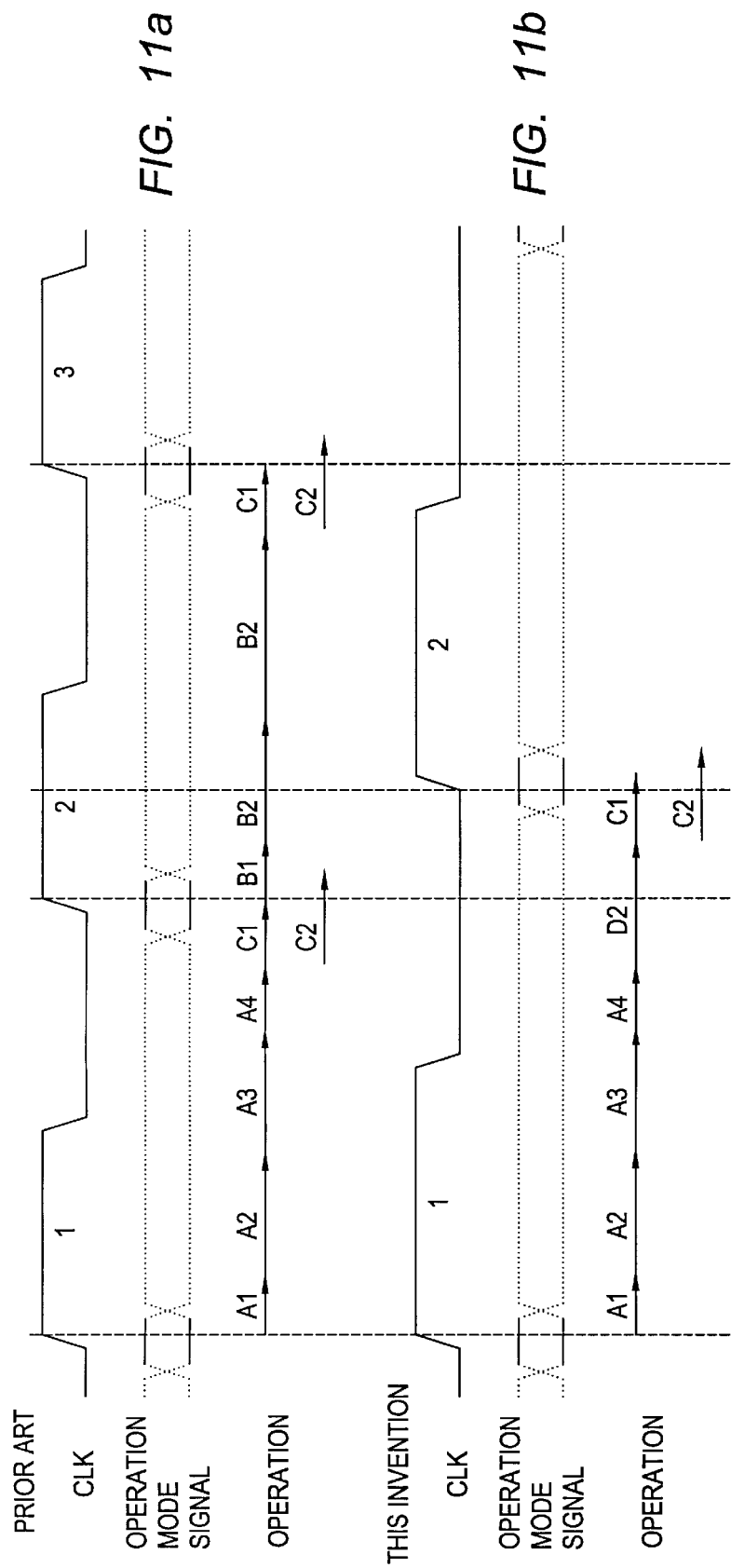
FIG. 11a is a timing chart which shows the internal operation of the prior art RAM in comparison with the present invention.
FIG. 11b is a timing chart which shows the operation of the present invention.
Figure 12:
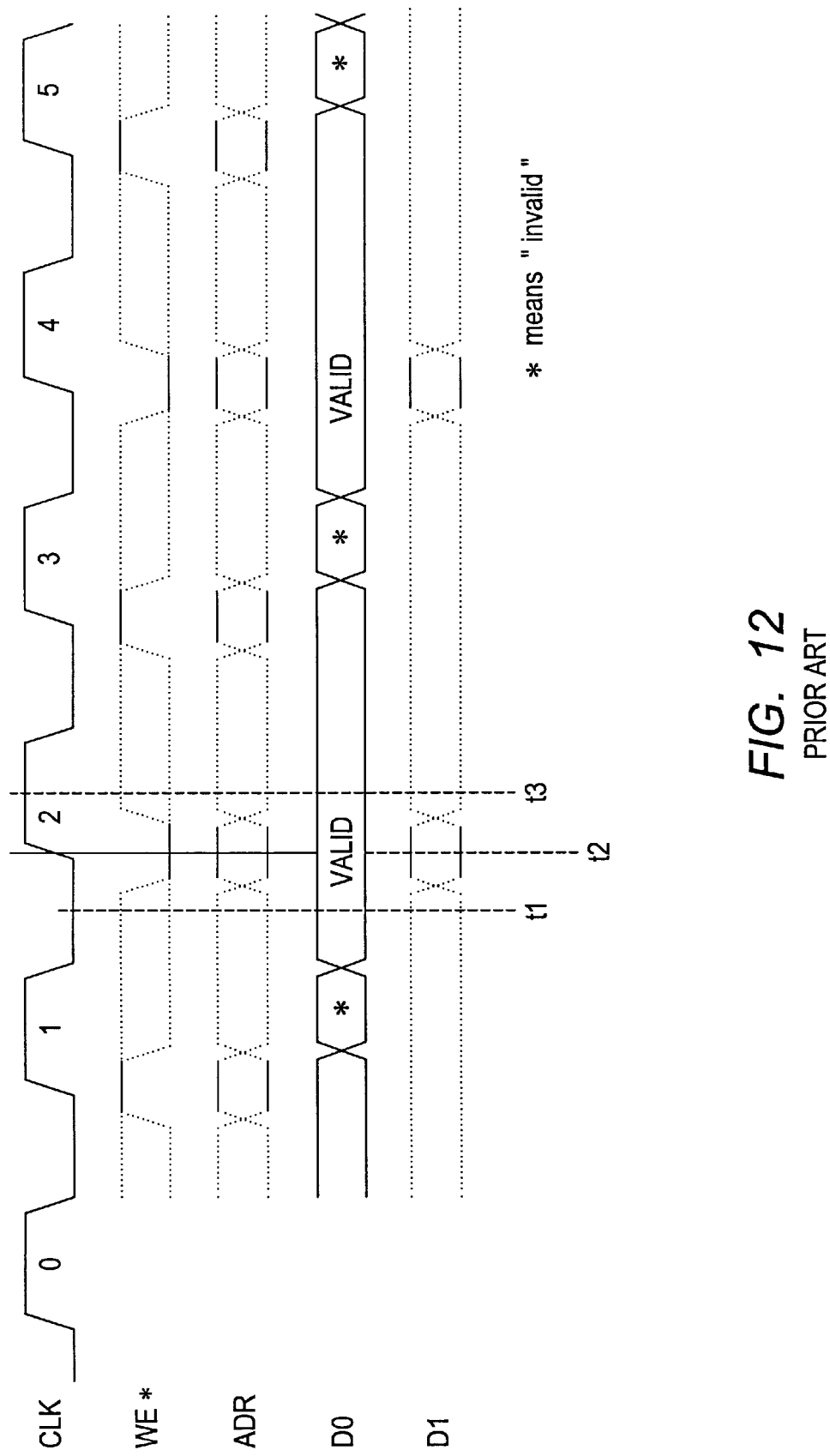
FIG. 12 is a timing chart which shows the operation of a first prior art RAM.

Hereafter, the function of the present invention is explained by using the timing chart of FIG. 11b while making a comparison with FIG. 11a, which is a prior art timing chart.

In the present invention, a read-and-write mode which performs the write-in access after performing the read-out access is provided, in addition to the read mode and the write mode. These operation modes are set by two or more external operation mode signals, and a mode signal input is provided in order to input these signals. The operation of the read-and-write mode is described below with reference to FIG. 11b.

D1 (operation mode judgment): The read-and-write mode is evaluated according to the operation mode signal. Here, in the present invention, as operation modes, since it is necessary to designate the read-and-write mode from outside, in addition to the read mode and the write mode, the operation signal of the read-and-write mode signal RWE* is provided in addition to the write-in signal WE*. Moreover, this D1 corresponds to A1 and B1 of the prior art.

A2 (address selection): Same as the read-out access A2 of the prior art. Moreover, in the prior art, A2 and B2 are the same.

A3 (sense amp operation): Same as the read-out access A3 of the prior art.

A4 (output data latch circuit operation): Same as the read-out access A4 of the prior art.

D2 (operation of write-in memory cell): Same as the write-in access B3 of the prior art.

C1 (release of the address selection): Same as the read-out access C1 of the prior art.

C2 (equalizing and pre-charge): Same as the read-out access C2 of the prior art.

As explained above, according to the present invention, when the read-and-write mode is additionally provided and when the read-out access and the write-in access are performed in this order with respect to the same address memory cell, it is possible to perform the read-out access and the write-in access in a single unit cycle, for example, in 1 clock (1 cycle) of the clock signal CLK. Also, according to the present invention, it is possible to improve the operation speed when performing data read-out and the write-in successively at the same address.

In FIG. 11b, which is one example, 1 cycle of the clock signal CLK is slightly longer than in the prior art. Even when it is extended like this, 1 cycle of the present invention is shorter than 2 cycles of the prior art. The read-and-write mode of the present invention is shorter than the prior example which takes 2 cycles to perform the read mode and the write mode.

When performing the read-out access and the write-in access in this order, with respect to a memory cell of the same address, in the prior art, after performing the former read-out access, after performing processes of the pre-charging and equalizing the bit line and the data line, and completion of other processing of the read-out access, the judgment of the operation mode and the address selection is repeated during the latter write-in access. This processing is redundant, and in the present invention, the operation speed is improved by eliminating this processing.

In the present embodiment, in order to set the read-and-write mode, the read-and-write mode signal RWE* is input to the control block. However, any signal which can set the read-and-write mode in conjunction with the RAS*, CAS* and WE* signals and the like is acceptable and does not need to be the read-and-write mode signal.

Moreover, in the present embodiment, in contrast to the second prior art, not only is input necessary to input the read-and-write mode signal RWE*, but it is also necessary for the terminal of the read-out data signal DO and the terminal of the write-in data signal DI to be independent, which causes an increase in the number of terminals. Increase of the number of terminals can be a problem when a RAM as a single unit is sealed in a package. However, it is no problem when the RAM is consolidated onto one chip with other logic circuits in an ASIC (application specific integrated circuit) or the like. Or, problems are unlikely to occur. This is because, when thus consolidated onto one chip, there is no actual limit to the number of terminals of the RAM.

What is claimed is:

1. A semiconductor memory device that accesses a memory cell in synchronization with a clock signal, comprising the following:

at least two mode signal inputs that input operation mode signals that designate one of a read mode, a write mode, and an operation mode provided with a read-and-write mode;

an input data latch circuit that temporarily stores data to be written into a memory cell; and an operation control circuit that evaluates the operation mode designated by said operation mode signals, and, when an operation mode designated by said operation mode signals is evaluated to be said read-and-write mode, controls successive operations of a read-out operation, that is the same as that of said read mode, in a first step within one clock cycle, and during this operation, temporarily stores data that is to be written in a memory cell in said input data latch circuit, and next, in a second step of the same clock cycle, writes-in data temporarily stored in said input data latch circuit to a memory cell selected in said first step.

2. The semiconductor memory device of claim 1, wherein said at least two mode signal inputs include mutually different signals of a row address strobe signal, a column address strobe signal, a write-in signal and a read-and-write mode signal.

3. The semiconductor memory device of claim 1, wherein said operation control circuit comprises a read-out control circuit, a write-in control circuit, and an operation mode judgment circuit that evaluates an operation mode that is designated by at least two operation mode signals that are input from an external source, and causes said read-out control circuit and said write-in control circuit to operate, and wherein said operation mode judgment circuit;

causes said read-out control circuit to operate when the operation mode is the read mode;

causes said write-in control circuit to operate when the operating mode is the write mode; and when the operation mode is the read-and-write mode, first activates said read-out control circuit, and after data read-out is complete, activates said write-in control circuit.

4. The semiconductor memory device of claim 1, wherein said semiconductor memory device is a dynamic random access memory.

5. A semiconductor integrated circuit that includes, in a portion thereof, a semiconductor memory device that accesses a memory cell in synchronization with a clock signal, said semiconductor memory device comprising:

at least two mode signal inputs that input operation mode signals that designate one of a read mode, a write mode, and an operation mode provided with a read-and-write mode;

an input data latch circuit that temporarily stores data to be written into a memory cell; and an operation control circuit that evaluates the operation mode designated by said operation mode signals, and, when an operation mode designated by said operation mode signals is evaluated to be said read-and-write mode, controls successive operations of a read-out operation, that is the same as that of said read mode, in a first step within one clock cycle, and during this operation, temporarily stores data that is to be written in a memory cell in said input data latch circuit, and next, in a second step of the same clock cycle, writes-in data temporarily stored in said input data latch circuit to a memory cell selected in said first step.

6. The semiconductor integrated circuit of claim 5, wherein said at least two mode signal inputs include mutually different signals of a row address strobe signal, a column address strobe signal, a write-in signal and a read-and-write mode signal.

7. The semiconductor integrated circuit of claim 5, wherein said operation control circuit comprises a read-out control circuit, a write-in control circuit, and an operation mode judgment circuit that evaluates an operation mode that is designated by at least two operation mode signals that are input from an external source, and causes said read-out control circuit and said write-in control circuit to operate, and wherein said operation mode judgment circuit;

causes said read-out control circuit to operate when the operation mode is the read mode;

causes said write-in control circuit to operate when the operating mode is the write mode; and when the operation mode is the read-and-write mode, first activates said read-out control circuit, and after data read-out is complete, activates said write-in control circuit.

8. The semiconductor memory device of claim 5, wherein said semiconductor memory device is a dynamic random access memory.

9. An electronic system that includes a memory device that accesses a memory cell in synchronization with a clock signal, said memory device comprising:

at least two mode signal inputs that input operation mode signals that designate one of a read mode, a write mode, and an operation mode provided with a read-and-write mode;

an input data latch circuit that temporarily stores data to be written into a memory cell; and an operation control circuit that evaluates the operation mode designated by said operation mode signals, and, when an operation mode designated by said operation mode signals is evaluated to be said read-and-write mode, controls successive operations of a read-out operation, that is the same as that of said read mode, in a first step within one clock cycle, and during this operation, temporarily stores data that is to be written in a memory cell in said input data latch circuit, and next, in a second step of the same clock cycle, writes-in data temporarily stored in said input data latch circuit to a memory cell selected in said first step.

10. The electronic system of claim 9, wherein said at least two mode signal inputs include mutually different signals of a row address strobe signal, a column address strobe signal, a write-in signal and a read-and-write mode signal.

11. The electronic system of claim 9, wherein said operation control circuit comprises a read-out control circuit, a write-in control circuit, and an operation mode judgment circuit that evaluates an operation mode that is designated by at least two operation mode signals that are input from an external source, and causes said read-out control circuit and said write-in control circuit to operate, and wherein said operation mode judgment circuit;

causes said read-out control circuit to operate when the operation mode is the read mode;

causes said write-in control circuit to operate when the operating mode is the write mode; and when the operation mode is the read-and-write mode, first activates said read-out control circuit, and after data read-out is complete, activates said write-in control circuit.

12. The electronic system of claim 9, wherein said memory device is a dynamic random access memory.

\* \* \* \* \*